United States Patent [19]
Tsinker

[11] Patent Number: 6,114,922
[45] Date of Patent: Sep. 5, 2000

[54] TRANSCONDUCTANCE COMPENSATION FOR PROCESS VARIATION IN EQUALIZERS

[75] Inventor: Vadim Tsinker, Belmont, Calif.

[73] Assignee: Advanced Micro Devices, Inc., Sunnyvale, Calif.

[21] Appl. No.: 09/248,274

[22] Filed: Feb. 11, 1999

Related U.S. Application Data

[60] Provisional application No. 60/082,183, Apr. 17, 1998.

[51] Int. Cl.$^7$ ....................................................... H03H 7/03
[52] U.S. Cl. ............................ 333/18; 333/28 R; 375/230
[58] Field of Search ..................................... 333/18, 28 R; 375/229, 230

[56] References Cited

U.S. PATENT DOCUMENTS

| | | | |
|---|---|---|---|
| 5,793,264 | 8/1998 | Taylor et al. | 333/28 R |
| 5,805,031 | 8/1998 | Cheng | 333/28 R |

*Primary Examiner*—Justin P. Bettendorf

[57] ABSTRACT

A network line equalizer is provided in combination with a compensation circuit. The network line equalizer includes first and second nodes, first and second current sources respectively connected to the first and second nodes, first and second transistors respectively connected also to the first and second nodes with a gate of the first transistor receiving a first signal of a differential pair of transmitted signals and a gate of the second transistor receiving a second signal of the differential pair of transmitted signals, a third transistor connected between the first and second nodes, and a control line connected to a gate of the third transistor. The compensation circuit includes third and fourth nodes corresponding to said first and second nodes, third and fourth current sources corresponding to the first and second current sources and respectively connected to the third and fourth nodes, fourth and fifth transistors respectively connected also to the third and fourth nodes and corresponding to the first and second transistors with a gate of the fourth transistor receiving the first signal of the differential pair of transmitted signals and a gate of the fifth transistor receiving the second signal of the differential pair of transmitted signals, a sixth transistor corresponding to said third transistor and connected between the third and fourth nodes with the control line connected also to a gate of the sixth transistor, and an output circuit configured to control the voltage on the control line. The output circuit has a current inducing circuit providing a current to a node of the control line where it is compared with a reference current. Changes in transconductance of any of the fourth through sixth transistors matching changes in transconductance of any of the first through third transistors and changing the current provided by the current inducing circuit and the voltage on the control line.

8 Claims, 2 Drawing Sheets

TRANSCONDUCTANCE COMPENSATION FOR PROCESS VARIATION IN EQUALIZERS

This invention claims priority from provisional Patent Application Serial No. 60/082,183, filed on Apr. 17, 1998, entitled "Quad Fast Ethernet Transceiver For 10 Base-T/100 Base-X (QFEX 10/100)" the entire disclosure of which is incorporated by reference herein.

FIELD OF THE INVENTION

The present invention relates to apparatus for compensating for variations in network line equalizers resulting from transistor transconductance (Gm).

BACKGROUND OF THE INVENTION

Local area networks use a network cable or other network media to link nodes (e.g., workstations, routers and switches) to the network. Each local area network architecture uses a media access control (MAC) enabling network interface device at each network node to share access to the media.

Physical (PHY) layer devices are configured for translating digital packet data received from a MAC across a standardized interface, e.g., a Media Independent Interface (MII), into an analog signal for transmission on the network medium, and reception of analog signals transmitted from a remote node via the network medium. An example is the 100BASE-TX Ethernet (IEEE Standard 802.3u) receiver, configured for receiving a three-level MLT-3 encoded analog signal at a 125 Mb/s data rate.

One problem with transmission of analog signals on the network medium is attenuation of high-frequency components. An MLT-3 encoded signal transmitted by the network medium encounter transmission loss in the form of high-frequency attenuation. Hence, the 100-BASE-TX Ethernet (IEEE 802.3u) receiver includes a line equalizer having a high-pass filter to compensate for the high-frequency attenuation from the network medium.

FIG. 1 is a circuit diagram illustrated an exemplary network active line equalizer 80 having a single zero high-pass filter 20. Transistors 28a and 28b, functioning as resistors, together with capacitors 30a and 30b comprise a single zero impedance circuit which connects first and second MOS transistors at corresponding first junctions N1 and N2. Transistors 28a and 28b (resistors) are PMOS devices. The characteristic of the high-pass filter can be easily changed by changing resistor value, e.g. changing the size of the MOS device. For example, the gate voltage of the devices 28a and 28b may be changed by varying the voltage of the control signal CONTROL. Varying the gate voltage of transistors 28a and 28b changes the effective resistance.

As shown in FIG. 1, bias current ($I_{B1}$ and $I_{B2}$) is supplied to transistors 32a, 32b, 34a and 34b for generating a bias current to nodes N1 and N2, respectively. Specifically, current flows into transistors 60 and 62 which is reflected into the MOS transistor pairs 32a, 32b and 34a, 34b. The pair of transistors 32a and 32b output the bias current $I_{B1}$ to node N1 and transistors 34a and 34b output the bias current $I_{B2}$ to node N2 ($I_{B1}=I_{B2}$). The MOS transistors 22 and 24 output differential currents having a difference corresponding to the impedance of MOS transistors 28a, 28b and 30a, 30b, and the differential input signals V1 and V2. The current mirror transistor 36 has a match, namely MOS transistor 42, that attempts to mirror the current of MOS transistor 36. Similarly, current mirror transistor 38 is matched by MOS transistor 46. Hence, the current in MOS transistor 36 will be reproduced in MOS transistor 42 and the current in MOS transistor 38 will be reproduced in MOS transistor 46. The current in MOS transistor 42 is dropped across load transistors 40a, 40b and 40c, converting the current to the output voltage $V_{O1}$. Similarly, the current in MOS transistor 46 is dropped across load transistors 48a, 48b and 48c, producing a voltage drop that converts the current to output voltage $V_{O2}$. In addition, the resistance values can be easily changed, either by changing the size of the MOS devices, or by individually controlling each of the MOS devices 40a, 40b, 40c, 48a, 48b and 48c.

The poles and zeros of most active line equalizers depend on precise values of resistance and capacitance used in the circuit. However, such precision is not possible with most semiconductor manufacturing processes due to process gradients, and temperature and power supply variations resulting from resistance, and to a certain extent, capacitance. However, a majority of the variation comes from transistor transconductance Gm (1/resistance).

A popular method of process and temperature compensation for Gm and capacitance variations is using a PLL (phase locked loop). In a PLL, a voltage controlled oscillator (VCO) is used to generate both a clock based on a Gm and capacitance C (of a device) which must be maintained, and a certain amount of current which is used to charge and discharge the Gm and C. This clock is referenced to an external fixed clock. If any change in the Gm or C occurs, the clock generated by the VCO will shift both in phase and frequency relative to the incoming fixed clock. The PLL will then adjust the Gm of the device to compensate for the change and synchronize the VCO to the incoming clock.

As PLL circuits are quite large compared to network line equalizers, the disadvantage of the method of using a PLL is that it requires an entire PLL to be formed on the chip to compensate the network line equalizer and the PLL circuit would occupy a larger area of the chip than that of the network line equalizer. This is not an efficient use of chip area. Furthermore, a PLL circuit is complicated to implement as additional simulation is needed to verify the functionality and stability of the PLL.

DISCLOSURE OF THE INVENTION

There is a need for a circuit which compensates for Gm based process/temperature voltage variations of a network line equalizer which does not require a PLL circuit, is easy to implement on a chip and results in efficient use of chip area.

This and other needs are attained by the present invention where a network line equalizer is provided in combination with a compensation circuit. The network line equalizer includes first and second nodes, first and second current sources respectively connected to the first and second nodes, first and second transistors respectively connected also to the first and second nodes with a gate of the first transistor receiving a first signal of a differential pair of transmitted signals and a gate of the second transistor receiving a second signal of the differential pair of transmitted signals, and a third transistor connected between the first and second nodes, and a control line connected to a gate of the third transistor. A current flowing between the first and second internal nodes is controlled by voltage on the control line. The a compensation circuit corresponds to the equalizer and includes third and fourth nodes corresponding to said first and second nodes, third and fourth current sources corresponding to the first and second current sources and respectively connected to the third and fourth nodes, fourth and fifth transistors respectively connected also to the third and fourth nodes and corresponding to the first and second transistors with a gate of the fourth transistor receiving a voltage corresponding to a voltage of the first signal of the differential pair of transmitted signals and a gate of the fifth transistor receiving a voltage corresponding to a voltage of the second signal of the differential pair of transmitted signals, a sixth transistor corresponding to the third transistor and connected between the third and fourth nodes with the control line connected to a gate of the sixth transistor, and an output circuit configured to control the voltage on the control line.

According to one aspect of the present invention, the output circuit has a current inducing circuit providing a current to a node of the control line, and a current comparator comparing the current provided to the node of the control line with a reference current. A change of the current provided to the node of the control line from the reference current changes voltage on the control line which changes the current flowing between the first and second nodes, and the current flowing between the third and fourth nodes.

Additional objects, advantages and novel features of the invention will be set forth in part in the description which follows, and in part may become apparent to those skilled in the art upon examination of the following or may be learned by practice of the invention. The objects and dvantages of the invention may be realized and attained by means of the instrumentalities and Combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1:
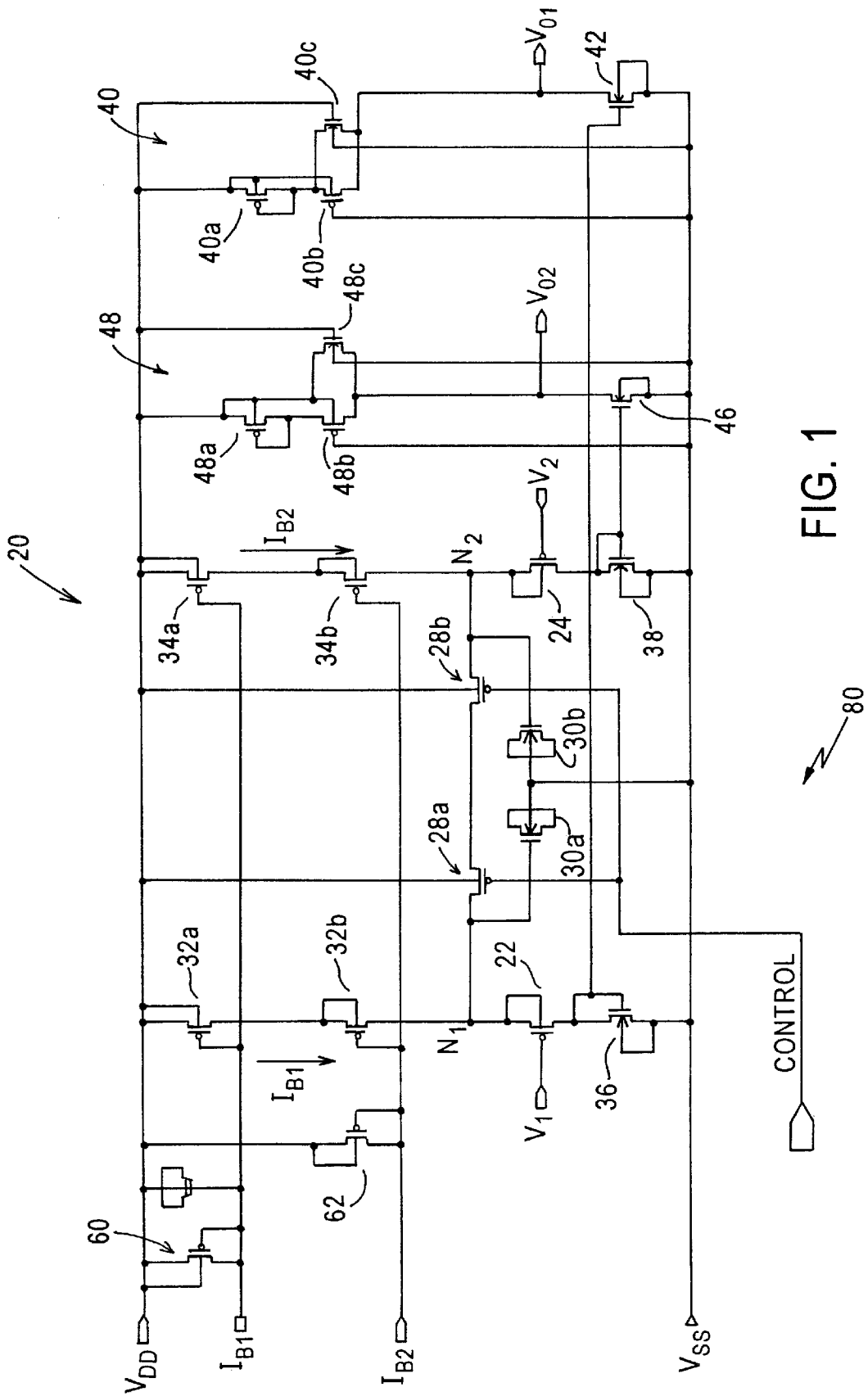
FIG. 1 is a schematic diagram of a network line equalizer.
Figure 2:
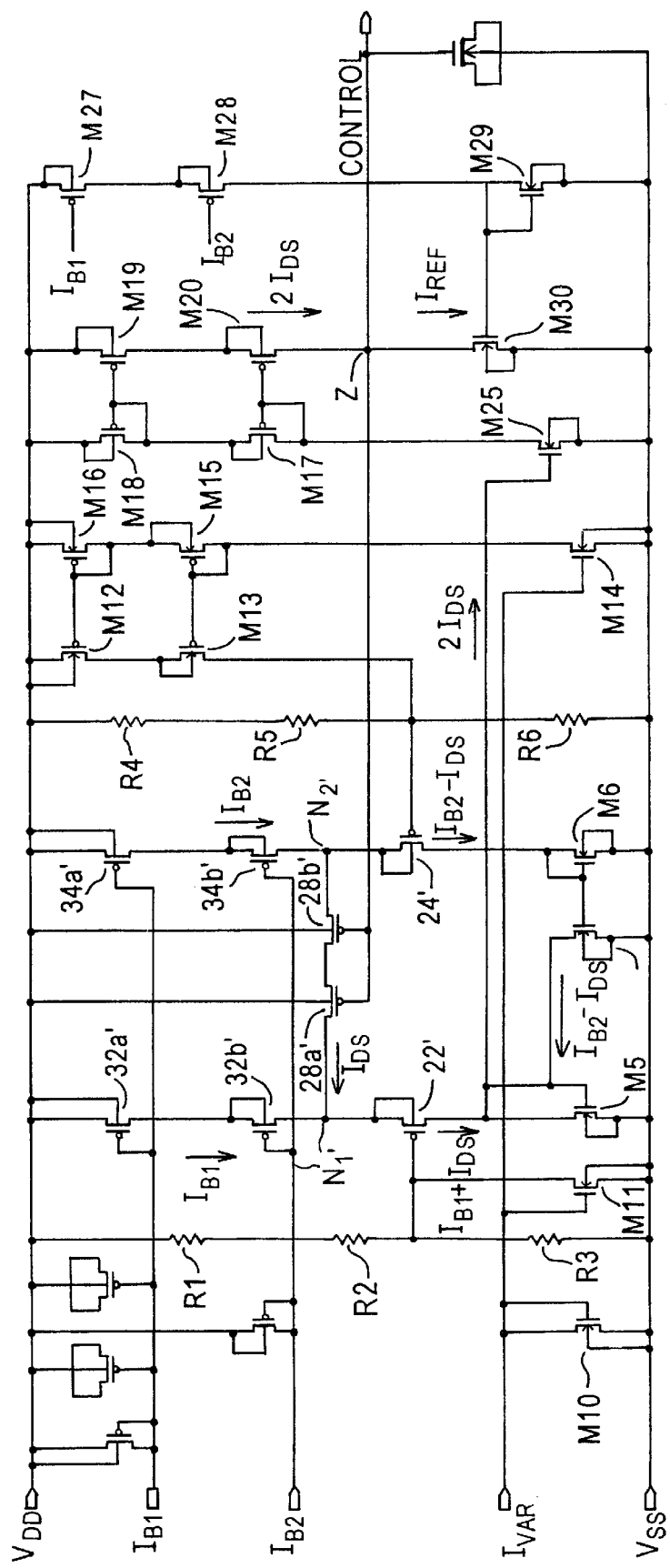
FIG. 2 is a schematic diagram illustrating in detail a compensation circuit according to the present invention.

FIG. 2 is a schematic diagram illustrating a compensation circuit 200 according to the present invention for compensating the network line equalizer 80 of FIG. 1. In the process compensation circuit 200, transistors 22', 24', 28a' and 28b' match transistors 22, 24, 28a and 28b in the equalizer 80. A resistor structure R1–R6 of the compensation circuit emulates external biasing of the equalizer 80 (not shown). This establishes an identical bias voltage at nodes N1', N2' of the compensation circuit and nodes N1, N2 of the equalizer. In addition, the source and drain voltages of Gm devices 28a', 28b' (transistors) of the compensation circuit 200 match that of Gm devices 28a, 28b (transistors) of the equalizer 80.

Two current sources, formed by transistors M10–M16, create a non-zero voltage between nodes N1' and N2' (M10, M11 and M14 have their gates connected to $I_{VAR}$). This voltage is necessary to establish current $I_{DS}$ though transistors 28a' and 28b'. The current flowing from node N1' is $I_{B1}+I_{DS}$ and the current flowing from node N2' is $I_{B2}-I_{DS}$. Consequently, $2I_{DS}=(I_{B1}+I_{DS}-(I_{B2}-I_{DS}))$ is mirrored to transistor M25, via transistors M5–M7, which is mirrored to comparison node Z via transistors M17–M20 where it is compared to $I_{REF}$ which is provided via transistors M27–M30. Since the compensation circuit 200 is designed to correspond to and be of approximate size as the equalizer 80, it is easily formed on the chip at the same time, and using the same process steps, as the equalizer 80.

Thus, the transistors 22', 24', 28a' and 28b' of the compensation circuit 200 will have the same variations in Gm as that of the transistors 22, 24, 28a and 28b of the equalizer. If Gm of device transistors 22', 24', 28a' and 28b' decreases, $I_{DS}$ will decrease, lowering the voltage at comparison node Z. Decrease of the voltage at comparison node Z results in decreasing the gate voltage of transistors 28a' and 28b' (P-type devices) which will increase $I_{DS}$. Similarly, if Gm of device transistors 22', 24', 28a' and 28b' increases, $I_{DS}$ will increase, raising the voltage at comparison node Z. Increase of the voltage at comparison node Z results in increase of the gate voltage of transistors 28a' and 28b' which will decrease $I_{DS}$. The identical decrease/increase in the voltage at comparison node Z is provided also to the gates of transistors 28a and 28b (P-type devices).

As noted, transistors 22', 24', 28a' and 28b' of the compensation circuit 200 match transistors 22, 24, 28a and 28b in the equalizer 80 which is formed on the same chip as the compensation circuit 200. Consequently, Gm variations in the transistors 22, 24, 28a and 28b of the equalizer 80 are compensated when the compensation circuit 200 automatically compensate for Gm variations in transistors 22', 24', 28a' and 28b'.

Thus, variations of Gm of transistors of a network line equalizer are compensated without using a PLL circuit via a compensation circuit formed on the same chip. Since the size of the compensation circuit corresponds generally to that of the network line equalizer and is formed at the same time, using the same process steps, it is easy to implement on the chip, effecting more efficient use of chip area. While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A combination, comprising:
   a network line equalizer receiving a differential pair of transmitted signals from a network medium and outputting a corrected differential pair of transmitted signals, said network line equalizer including
   first and second nodes,
   first and second current sources respectively connected to the first and second nodes,
   first and second transistors respectively connected also to the first and second nodes, a gate of the first transistor receiving a first signal of the differential pair of transmitted signals and a gate of the second transistor receiving a second signal of the differential pair of transmitted signals,
   a third transistor connected between the first and second nodes,
   a control line connected to a gate of the third transistor with a current flowing between the first and second nodes being controlled by voltage on said control line; and
   a compensation circuit corresponding to said equalizer, said compensation circuit including
   third and fourth nodes corresponding to said first and second nodes,
   third and fourth current sources corresponding to the first and second current sources and respectively connected to the third and fourth nodes,
   fourth and fifth transistors respectively connected also to the third and fourth nodes and corresponding to the first and second transistors, a gate of the fourth transistor receiving a voltage corresponding to a bias voltage on the gate of the first transistor, the gate of the fifth transistor receiving a voltage corresponding to a bias voltage on the gate of the second transistor with the bias voltage on the gate of the first transistor being equal to the bias voltage on the gate of the second transistor, a non-zero voltage difference between the gate of the fourth and fifth transistors being created by a plurality of current sources, differing from the first and second current sources, such that the voltage on the gate of fourth transistor is equal a bias voltage set by a first plurality of resistors minus voltage set by first plural current sources of the plurality of current sources, and the voltage on the gate of the fifth transistor is equal to a bias voltage set by a second plurality of resistors, different from the first plurality of resistors, plus a voltage set by second plural current sources, a sixth transistor corresponding to said third transistor and connected between the third and fourth nodes with the control line connected to a gate of the sixth transistor and a current flowing between the third and fourth nodes being controlled also by voltage on said control line, and an output circuit configured to control the voltage on the control line.

2. The combination according to claim 1, wherein the output circuit comprises:

a current inducing circuit providing a current to a node of said control line, and a current comparator comparing the current provided to the node of said control line with a reference current, change of said current provided to the node of said control line from the reference current changing voltage on the control line.

3. The combination according to claim 2, wherein said current inducing circuit comprises a current mirror circuit.

4. The combination according to claim 3, wherein the current provided to the node of said control line is twice the current flowing through the sixth transistor.

5. The combination according to claim 3, wherein the first through sixth transistors are MOS transistors.

6. For a line equalizer having first and second transistors, each having a gate for receiving a corresponding differential input signal and first and second junctions, a single zero impedance circuit connecting the first and second transistors at the corresponding first junctions, a first current source supplying a first bias current to a first node connecting the first junction of the first transistor and a first end of the single zero impedance circuit, and a second current source supplying a second bias current to a second node connecting the first junction of the second transistor and a second end of the single zero impedance circuit, said first bias current being equal to said second bias current said single zero impedance circuit including at least third and fourth transistors having their gates commonly connected to a control line and selectively changing their respective impedance in response to a control signal on the control line, a compensator compensating transconductance variations in said first through fourth transistors, comprising:

a third current source connected to a third node and providing the first bias current;

a fourth current source connected to a fourth node and providing the second bias current;

a circuit connected between the third and fourth nodes, the circuit including at least fifth through eighth transistors identical to said at least first through fourth transistors, respectively, with the seventh and eighth transistors having their gates commonly connected to the control line, a bias voltage at the first and second nodes being substantially equal to a bias voltage at the third and fourths nodes; and an output circuit connected to control voltage on the control line.

7. The compensator according to claim 6, wherein the output circuit comprises a current mirror circuit mirroring twice the current flowing through the seventh and eighth transistors.

8. The compensator according to claim 7, wherein the output circuit further comprises a current comparator connected to said control line and comparing the mirrored current of said current mirror circuit with a comparing current, changes in transconductance of any of the at least seventh and eighth transistors respectively matching changes in transconductance of any of said at least third and fourth transistors and changing the mirrored current of said current mirror circuit and the voltage on said control line.

* * * * *